United States Patent
Gerald, II et al.

(10) Patent No.: US 7,602,181 B1
(45) Date of Patent: Oct. 13, 2009

(54) APPARATUS AND METHOD FOR GENERATING A MAGNETIC FIELD BY ROTATION OF A CHARGE HOLDING OBJECT

(75) Inventors: Rex E. Gerald, II, Brookfield, IL (US); Lela Vukovic, Westchester, IL (US); Jerome W. Rathke, Homer Glenn, IL (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 11/955,438

(22) Filed: Dec. 13, 2007

(51) Int. Cl.
*G01V 3/00* (2006.01)
(52) U.S. Cl. .................... 324/307; 324/321
(58) Field of Classification Search .......... 324/300–322
See application file for complete search history.

(56) References Cited

U.S. PATENT DOCUMENTS

| | | | |
|---|---|---|---|
| 4,601,211 A * | 7/1986 | Whistler | 73/863.33 |
| 4,931,640 A * | 6/1990 | Marshall et al. | 250/291 |
| 5,298,864 A * | 3/1994 | Muller et al. | 324/321 |
| 5,552,709 A * | 9/1996 | Anderson | 324/321 |
| 5,754,048 A * | 5/1998 | Bielecki | 324/321 |
| 5,760,586 A * | 6/1998 | Foerster et al. | 324/321 |
| 6,522,910 B1 * | 2/2003 | Gregory | 600/427 |
| 6,583,622 B1 * | 6/2003 | Hills | 324/307 |
| 6,584,413 B1 * | 6/2003 | Keenan et al. | 702/28 |
| 6,675,106 B1 * | 1/2004 | Keenan et al. | 702/28 |
| 7,015,463 B2 * | 3/2006 | Cotter et al. | 250/288 |
| 7,056,466 B2 * | 6/2006 | Wang et al. | 264/405 |
| 7,163,655 B2 * | 1/2007 | Weber et al. | 264/474 |
| 7,197,116 B2 * | 3/2007 | Dunham et al. | 378/124 |
| 7,486,078 B1 | 2/2009 | Gerald, II | |
| 2002/0058869 A1 * | 5/2002 | Axelsson et al. | 600/423 |

* cited by examiner

*Primary Examiner*—Brij B. Shrivastav
*Assistant Examiner*—Dixomara Vargas
(74) *Attorney, Agent, or Firm*—Michael J. Dobbs; Brian J. Lally; Paul A. Gottlieb

(57) ABSTRACT

A device and a method for the production of a magnetic field using a Charge Holding Object that is mechanically rotated. In a preferred embodiment, a Charge Holding Object surrounding a sample rotates and subjects the sample to one or more magnetic fields. The one or more magnetic fields are used by NMR Electronics connected to an NMR Conductor positioned within the Charge Holding Object to perform NMR analysis of the sample.

20 Claims, 11 Drawing Sheets

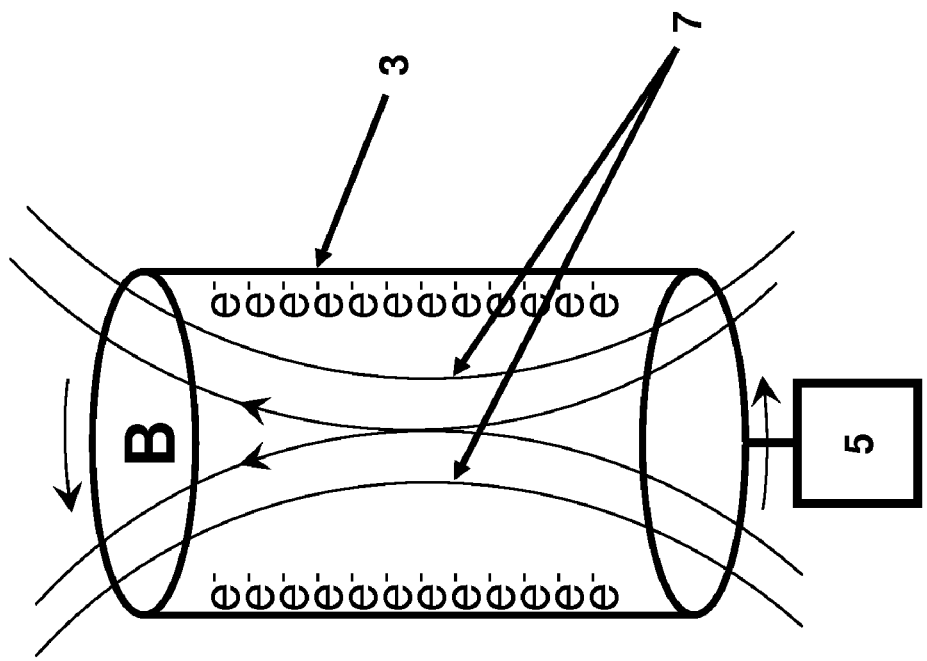
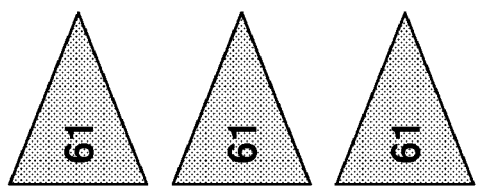
FIG. 10

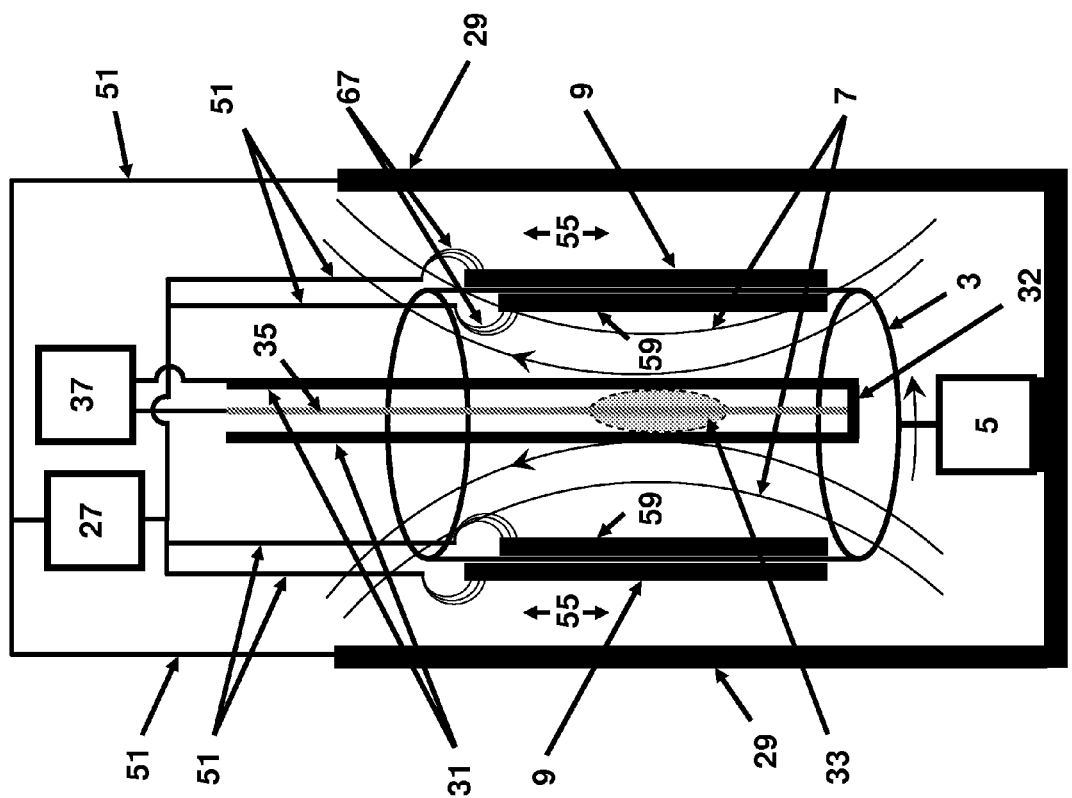
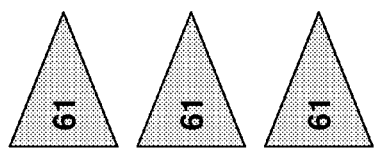
FIG. 11

US 7,602,181 B1

APPARATUS AND METHOD FOR GENERATING A MAGNETIC FIELD BY ROTATION OF A CHARGE HOLDING OBJECT

GOVERNMENT INTERESTS

The United States Government has rights in this invention pursuant to Contract No. W-31-109-ENG-38, between the U.S. Department of Energy (DOE) and the University of Chicago.

FIELD OF THE INVENTION

The present invention relates to the generation of a Magnetic Field from the rotation of a Charge Holding Object. Preferably, the Magnetic Field is used in an NMR (Nuclear Magnetic Resonance) system.

BACKGROUND OF THE INVENTION

Magnetic Fields have a myriad of uses ranging from medical (MRI), chemical (NMR), motors, generators, high energy plasma physics, fusion reactors, particle accelerators, photon sources from synchrotron radiation, as well as many others. Although the creation of Magnetic Fields is a key aspect of various technologies, there are only a handful of known methods for creating Magnetic Fields.

Permanent magnets are one source of a Magnetic Field. They are naturally magnetic, but relative to other sources of magnetism, they are bulky and produce a weak Magnetic Field. Rare-earth magnets generally produce a stronger Magnetic Field compared to common iron-based magnets, but are too weak for most high-field uses.

Electromagnets create a Magnetic Field from an electrical current. Since the Magnetic Field is directly related to the electrical current, the strength of the Magnetic Field may be altered by increasing or decreasing the electrical current. Wrapping a current carrying wire into the form of a coil allows the Magnetic Field to be focused, increasing flux gain of the Magnetic Field. For larger Magnetic Fields, a superconducting wire is used to sustain a tremendous amount of electrical current while limiting ohmic losses (dissipated energy due to wire resistance).

Superconductors are currently the only viable option for generating large and persistent Magnetic Fields, for example those used in NMR. Unfortunately, superconducting magnets must be continuously cooled at temperatures at least below about 100 K (and typically around 4K), and the cryogenic systems needed to maintain these temperatures are cumbersome and expensive to operate.

In NMR, the Magnetic Fields are preferably strong, homogeneous, and stable. Although magnets, electromagnets, and superconductors are able to produce Magnetic Fields, the fields are difficult to make homogeneous and stable since even very minor material defects or winding defects in magnetic coils can cause significant field distortions. These imperfections are difficult and sometimes impossible to correct. Furthermore, in superconductors these imperfections cannot be easily determined until the magnetic coils are cryogenically cooled and in operation. The result is a Magnetic Field, which cannot be easily perfected and is inhomogeneous, thereby limiting NMR resolution.

Devices for generating small magnetic fields using direct current coils operating at room temperature have been developed to correct small distortions in the magnetic fields generated by superconducting magnets, and have become essential for improving NMR resolution. The magnitudes of these correction fields are typically 10,000 times smaller than the magnetic field produced by the superconducting magnet.

Therefore, it is desirable to have a device capable of generating a large Magnetic Field without requiring superconductors and the associated large cryogenic coolers. Furthermore, it is desirable to have a device capable of generating a large Magnetic Field that can be finely adjusted to create a strong, stable, and homogenous Magnetic Field.

SUMMARY OF THE INVENTION

A device and method for generating a Magnetic Field from the rotation of a Charge Holding Object. In one embodiment, a Charge Holding Object is rotated, generating a Magnetic Field parallel to a Rotation Axis of the Charge Holding Object. In the preferred embodiment, a strong, homogeneous, and stable Magnetic Field is created by the constant-speed rotation of a Charge Holding Object and used in an NMR system.

BRIEF DESCRIPTION OF THE DRAWINGS

FIG. 10 depicts an embodiment for the generation of one or more Magnetic Fields by rotating a Charge Holding Object continuously charged by one or more Electron Guns.

FIG. 11 depicts an embodiment for the generation of one or more Magnetic Fields by rotating a Charge Holding Object held continuously charged by an Interior Conductive Coating, an Exterior Conductive Coating, and an Electron Gun, whereby the generated one or more magnetic fields are used in magnetic resonance experiments.

DETAILED DESCRIPTION OF THE INVENTION

A device and method for generating one or more Magnetic Fields from the rotation of a Charge Holding Object. Preferably, the rotation of a Charge Holding Object produces a strong Magnetic Field used in a NMR (Nuclear Magnetic Resonance) system.

FIG. 1

Figure 1:
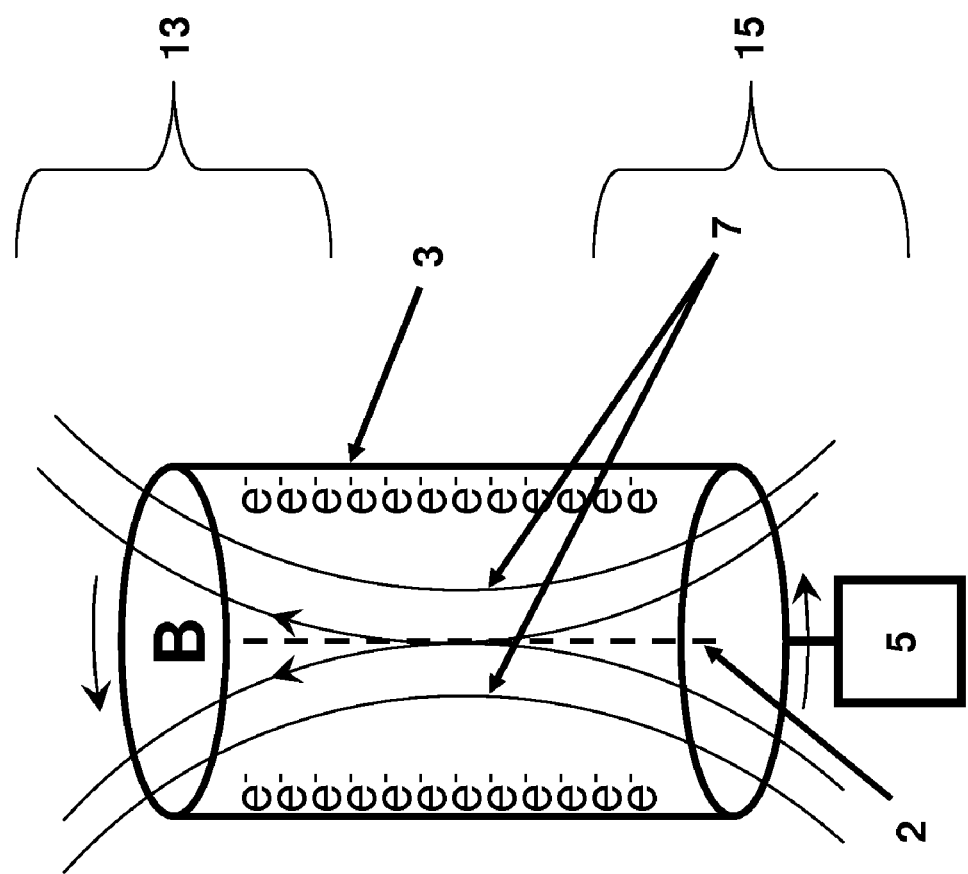
FIG. 1 depicts an embodiment for the generation of one or more Magnetic Fields by rotating a Charge Holding Object.

FIG. 1 depicts an embodiment for the generation of one or more Magnetic Fields 7 by rotating a Charge Holding Object 3 about a Rotation Axis 2. In this embodiment, a Charge Holding Object 3 is connected to a Rotating Means 5, which rotates the Charge Holding Object 3. The rotation of the Charge Holding Object 3 generates one or more Magnetic Fields 7.

Charge Holding Object

The Charge Holding Object 3 is any material capable of holding an electrical charge. Preferably the Charge Holding Object 3 is a dielectric. In the alternative, conductors, preferably non-magnetic metals such as aluminum, silver, gold, titanium, beryllium, and copper, may also be used. Preferably, non-magnetic materials are used to avoid undesirable magnetic interaction with other magnetic and electromagnetic fields. More preferably, the Charge Holding Object 3 is made of a plastic or ceramic. In the preferred embodiment, the Charge Holding Object 3 is made of zirconia ($ZrO_2$). The Charge Holding Object 3 may have any shape including, but not limited to, cylindrical, prolate spheroid, rectangular, cubicle, pyramidal, combinations thereof, or any other shape. In the preferred embodiment, the Charge Holding Object 3 has a cylindrical shape, as shown in FIG. 1.

The Charge Holding Object 3 is electrically charged, having excess electrons or an electron deficiency, by any means known in the art. The Charge Holding Object 3 rotates about a Rotation Axis 2 and has a Top End 13 and a Bottom End 15. Preferably, the Charge Holding Object 3 is charged by a voltage source, electron gun or other electron source. Examples of electron guns include, field emission, thermionic electron gun, for example heated tungsten (such as described in U.S. Pat. No. 6,828,996), laser based electron guns, and combinations thereof.

The Charge Holding Object 3 may be charged and electrically insulated to prevent charge leakage. For example, in one embodiment, the Charge Holding Object 3 is charged by an electron gun and stored in a vacuum to prevent charge leakage. However, due to the difficulty of maintaining a strong charge in the Charge Holding Object 3, it is preferable to continuously charge the Charge Holding Object 3. In the preferred embodiment, the Charge Holding Object 3 is continuously charged using a voltage source, such as in the embodiment shown in FIG. 2.

In one embodiment, the Charge Holding Object 3 is a single homogenous material holding electrical charges, while also sustaining rotation forces. In a preferred embodiment, the Charge Holding Object 3 is a material capable of rotation at high speeds and having one or more conductive coatings containing the electrical charge. Preferably, the Charge Holding Object 3 is designed to exceed 1000 rps (rotations per second), preferably exceeding 100,000 rps.

Rotating Means

The Rotating Means 5 is any means known in the art for rotating the Charge Holding Object 3. Preferably, the rotating means utilizes a turbine or motor (electric, thermodynamic, molecular, pneumatic, hydraulic, or synthetic) or a combination thereof design, as well as any other means as known in the art. In a preferred embodiment, the Rotating Means 5 is a fluid source supplying a fluid to a turbine fixedly connected to the Charge Holding Object 3. Preferably, a compressed gas is used to rotate the turbine, and therefore the Charge Holding Object 3. A turbine may be preferable in NMR systems due to its simplicity and minimal electromagnetic noise.

The Rotation Means 5 rotates the Charge Holding Object 3 at a speed or speeds optimized for the desired one or more Magnetic Fields 7, while below the mechanical breakdown speed of the Charge Holding Object 3. Preferably, the Rotation Means 5 rotates the Charge Holding Object 3 at a speed or speeds exceeding 100,000 rps (rotations per second), more preferably faster than 1000 rps.

FIG. 2

Figure 2:
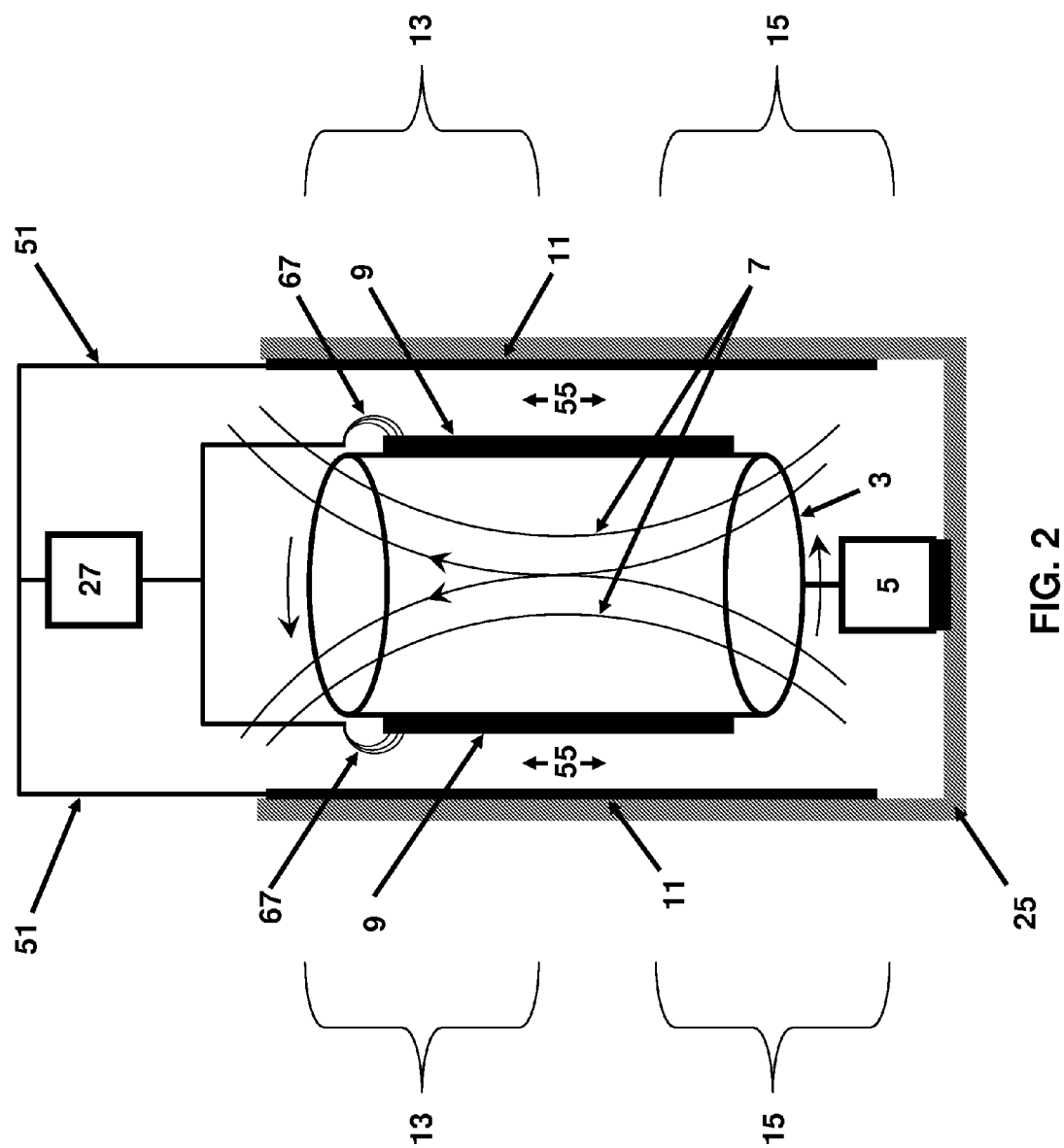
FIG. 2 depicts an embodiment for the generation of one or more Magnetic Fields by rotating a Charge Holding Object having an Exterior Conductive Coating continuously charged by a Voltage Source.

FIG. 2 depicts an embodiment for the generation of one or more Magnetic Fields 7 by rotating a Charge Holding Object 3 having an Exterior Conductive Coating 9 continuously charged by a Voltage Source 27. In this embodiment, a Charge Holding Object 3, having an Interior and an Exterior, is connected to a Rotating Means 5 which rotates the Charge Holding Object 3. The Exterior of the Charge Holding Object 3 is coated with an Exterior Conductive Coating 9. An Outer Cylinder 25 is rigidly connected to the Rotating Means 5 and also rigidly connected to one or more Outer Conductors 11. A Voltage Source 27 is electrically connected by one or more Wires 51 and one or more Wire Brushes 67 to the External Conductive Coating 9 and electrically connected to the one or more Outer Conductors 11 by one or more Wires 51. Voltage Source 27 provides a voltage across the External Conductive Coating 9 and the one or more Outer Conductors 11.

Outer Cylinder

The Outer Cylinder 25 mechanically connects the Rotating Means 5 and the one or more Outer Conductors 11. Preferably, the Outer Cylinder 25 is made of a non-magnetic material to prevent interaction with the one or more Magnetic Fields 7 generated by the rotating Charge Holding Object 3. In a preferred embodiment, the one or more Outer Conductors 11 are used as a Outer Cylinder 25, whereby the one or more Outer Conductors 11 are mechanically connected to the Rotating Means 5. The Outer Cylinder 25 preferably has a cylindrical shape, but any other shape may also be used, as known in the art. Furthermore, any other connecting means may be used to connect the Rotating Means 5 and the one or more Outer Conductors 11 as known in the art. For example, a simple frame may be used to directly, mechanically connect the Rotating Means 5 to the one or more Outer Conductors 11. In the alternative, the Outer Conducts 11 may themselves be used to connect the Rotating Means 5 and the one or more Outer Conductors 11, as depicted in FIGS. 7, 8, 9, and 11.

Exterior Conductive Coating

Figure 9:
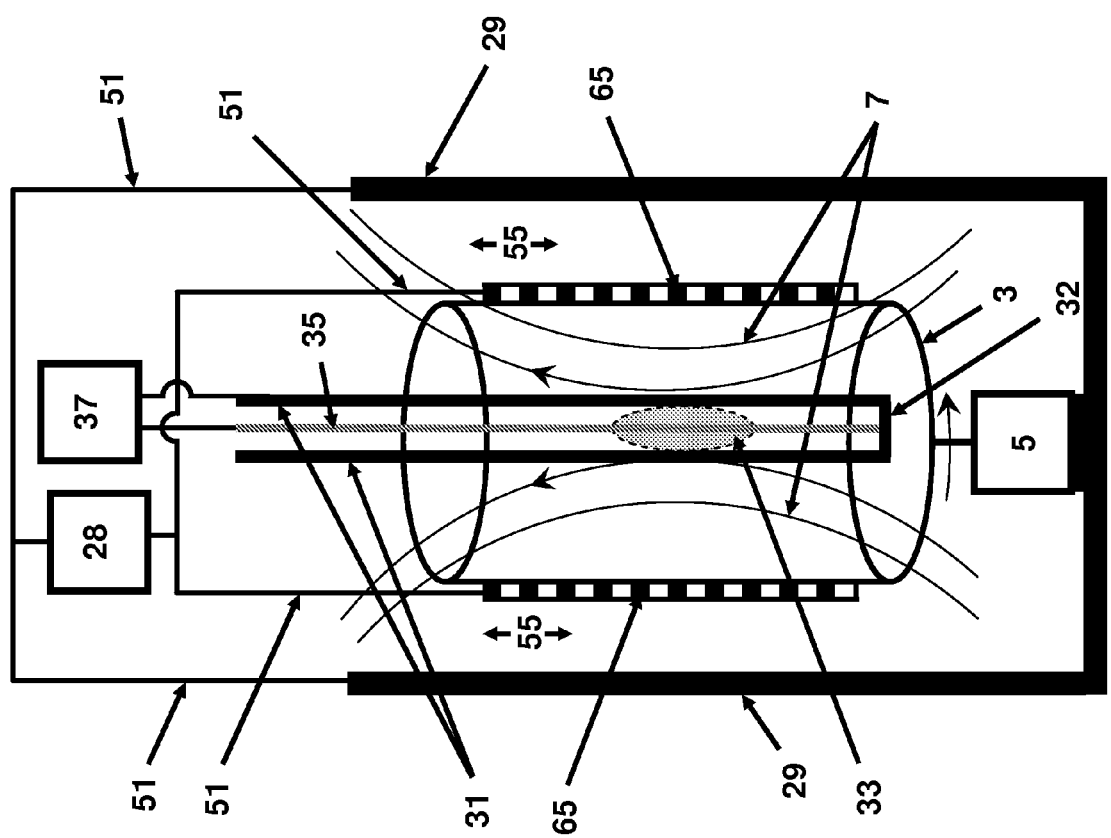
FIG. 9 depicts an embodiment for the generation of one or more Magnetic Fields by rotating a Charge Holding Object having a means for selectively charging and selectively discharging the Charge Holding Object, whereby the generated one or more magnetic fields are used in magnetic resonance experiments.

The Exterior Conductive Coating 9 is an electrically conductive coating at least partially covering the Exterior of the Charge Holding Object 3. In a preferred embodiment, the Exterior Conductive Coating 9 is made of a non-magnetic metal such as aluminum, silver, gold, titanium, beryllium, copper, or a combination thereof, as well as other metals known in the art. Preferably, the Exterior Conductive Coating 9 completely covers the Exterior of the Charge Holding Object 3. In the alternative, the Exterior Coating 9 may be an Array of Electrically Isolated Elements, as shown in FIG. 9.

One or More Outer Conductors

The one or more Outer Conductors 11 are each electrically conductive. In a preferred embodiment, the one or more Outer Conductors 11 are made of non-magnetic metals such as aluminum, sliver, gold, titanium, beryllium, copper, or a combination thereof, as well as other metals known in the art. Preferably, the one or more Outer Conductors 11 have a length longer than the length of the Charge Holding Object 3 to uniformly charge the Charge Holding Object 3. In the alternative, the one or more Outer Conductors 11 are a plurality of conductors, preferably surrounding the Charge Holding Object 3. The one or more Outer Conductors 11 can each have a variety of shapes, but are preferably a single cylinder surrounding the Charge Holding Object 3.

In order to maintain a more uniform charge across the Charge Holding Object 3, the Exterior Conductive Coating 9 preferably completely covers the Exterior of the Charge Holding Object 3 and the one or more Outer Conductors 11 are longer than the length of the Charge Holding Object 3, or extend beyond the Top End 13 of the Charge Holding Object 3 and the Bottom End 15 of the Charge Holding Object 3. In the alternative, other variations may be desirable for creating a variety of uniform and non-uniform magnetic fields.

However, it may be desirable to customize the Magnetic Field 7, by altering the Exterior Conductive Coating 9, the one or more Outer Conductors 11, or combinations thereof. For example, if the one or more Outer Conductors 11 run the approximate length of the Charge Holding Object 3, the Top End 13 and the Bottom End 15 of the Charge Holding Object 3 will have less of a charge than the center of the Charge Holding Object 3, creating a non-uniform Magnetic Field, which may or may not be desirable depending on the application. A spheroid shaped Charge Holding Object 3 may be desirable to create a uniform magnetic field; the tapered ends of a spheroid can be employed to intensify the magnetic field at the top and bottom of the Charge Holding Object 3 in order to compensate for end effects. The Exterior Conductive Coating 9 may be customized, for example, by altering the shape, distribution, and material thickness.

One or More Wire Brushes

The one or more Wire Brushes 67 with the one or more Wires 51 electrically connect the Voltage Source 27 to the External Conductive Coating 9. The Wire Brushes 67 electrically connect to the External Conductive Coating 9, whereby the Charge Holding Object 3 is allowed to rotate about its Rotational Axis 2. As known in the art, other means may be used to electrically connect the Voltage Source 27 to the External Conductive Coating 9, while allowing the Charge Holding Object 3 to rotate about its Rotational Axis 2. For example, conductive bearings, fluids, gears, and combinations thereof may be used to electrically connect the Voltage Source 27 to the External Conductive Coating 9 while allowing the Charge Holding Object 3 to rotate about its Rotational Axis 2.

Voltage Source

The Voltage Source 27 provides a voltage difference across the Exterior Conductive Coating 9 and the one or more Outer Conductors 11. The Voltage Source 27 preferably produces a DC voltage across the Exterior Conductive Coating 9 and the one or more Outer Conductors 11. In the alternative, various waveforms may be supplied, for example square, sinusoidal, triangular waves, to vary the Magnetic Field 7. The Voltage Source 27 preferably supplies a voltage optimized for the desired magnetic field. Preferably, the Voltage Source 27 supplies about 1 Volt to 10,000 Volts, more preferably greater than 1,000 Volts. In a preferred embodiment the Voltage Source 27 supplies about 1,000 to 5,000 Volts.

The Rotation Means

Figure 4:
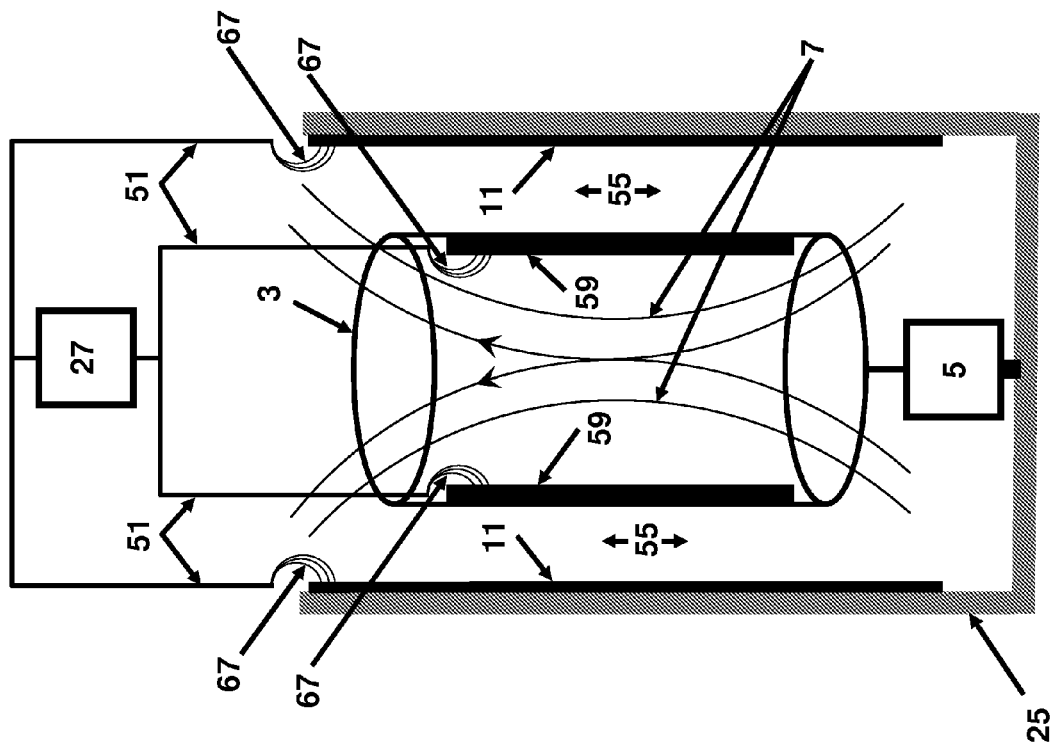
FIG. 4 depicts an embodiment for the generation of one or more Magnetic Fields by rotating a Charge Holding Object having an Interior Conductive Coating continuously charged by a Voltage Source.

The Rotation Means 5 rotates the Charge Holding Object 3. Preferably, the rotation means is an electric motor, air turbine, or other means for rotating the Charge Holding Object 3 as known in the art. The Rotation Means 5 may rotate the Charge Holding Object 3, while also rotating the counter charge, the one or more Outer Conductors 11, in the opposite direction. The counter rotation of opposite charges will increase the resulting one or more Magnetic Fields 7. An example of this is shown in FIG. 4 where the Rotation Means 5 rotates both the Charge Holding Object 3 and one or more Outer Conductors in opposite directions.

FIG. 3

Figure 3:
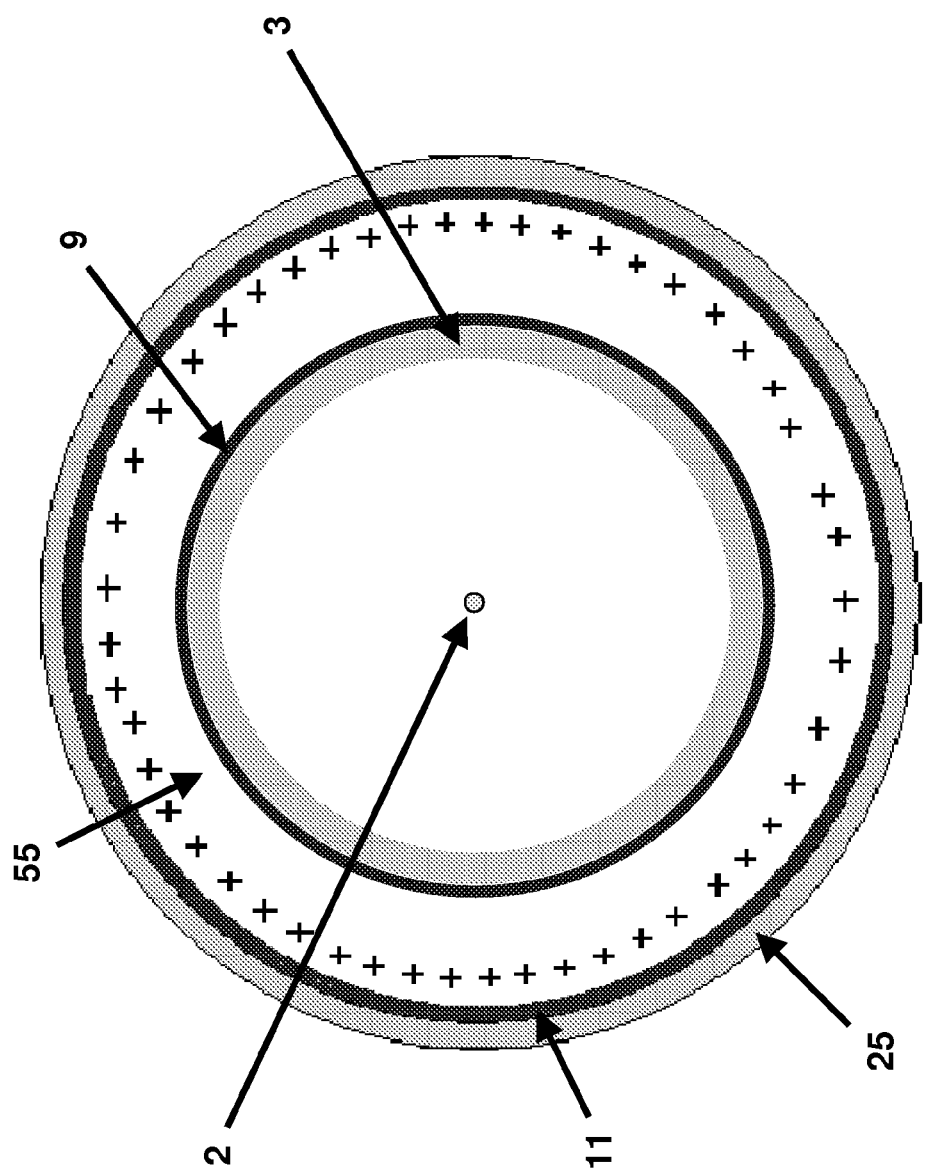
FIG. 3 depicts a cross-section view of an embodiment for the generation of one or more Magnetic Fields by rotating a Charge Holding Object having an Exterior Conductive Coating and encased by a cylindrical Outer Conductor.

Preferably, the Charge Holding Object 3, the Exterior Conductive Coating 9 and the one or more Outer Conductors 11 are optimized for maximum homogeneity of Magnetic Field 7. FIG. 3 depicts a cross-section view of one embodiment comprising a Charge Holding Object 3 having an Exterior Conductive Coating 9, as in FIG. 2. In this embodiment, the Outer Cylinder 25 has a cylindrical shape. The one or more Outer Conductors 11, a conductive cylinder, is positioned inside and juxtaposed to the Outer Cylinder 25. A First Insulator 55 separates the one or more Outer Conductors 11 from the Charge Holding Object 3. The First Insulator 55 is electrically insulating, and allows the Charge Holding Object 3 to rotate about a Rotation Axis 2. Preferably, the First Insulator 55 is a gas. In the alternative, the First Insulator 55 is an electrically insulating material, preferably a fluid. In the preferred embodiment, the First Insulator 55 is a liquid, gas, or solid perfluoropolyalkylether (PFPE) or derivatives. In this embodiment, the First Insulator 55 is the only separation between the one or more Outer Electrodes 11 and the Exterior Conductive Coating 9. Therefore, capacitance of the Charge Holding Object 3 can be maximized by maximizing the dielectric constant of the First Insulator 55 material. The First Insulator 55 preferably separates the one or more Outer Electrodes 11 and the Exterior Conductive Coating 9 as little as possible without allowing physical interaction or dielectric breakdown. Preferably the separation between the one or more Outer Electrodes 11 and the Exterior Conductive Coating 9 is between 1 nm and 100 μm, more preferably between 10 nm and 10 μm. In a preferred embodiment, the separation between the one or more Outer Electrodes 11 and the Exterior Conductive Coating 9 is between 50 nm and 500 nm.

FIG. 4 and FIG. 5

Figure 5:
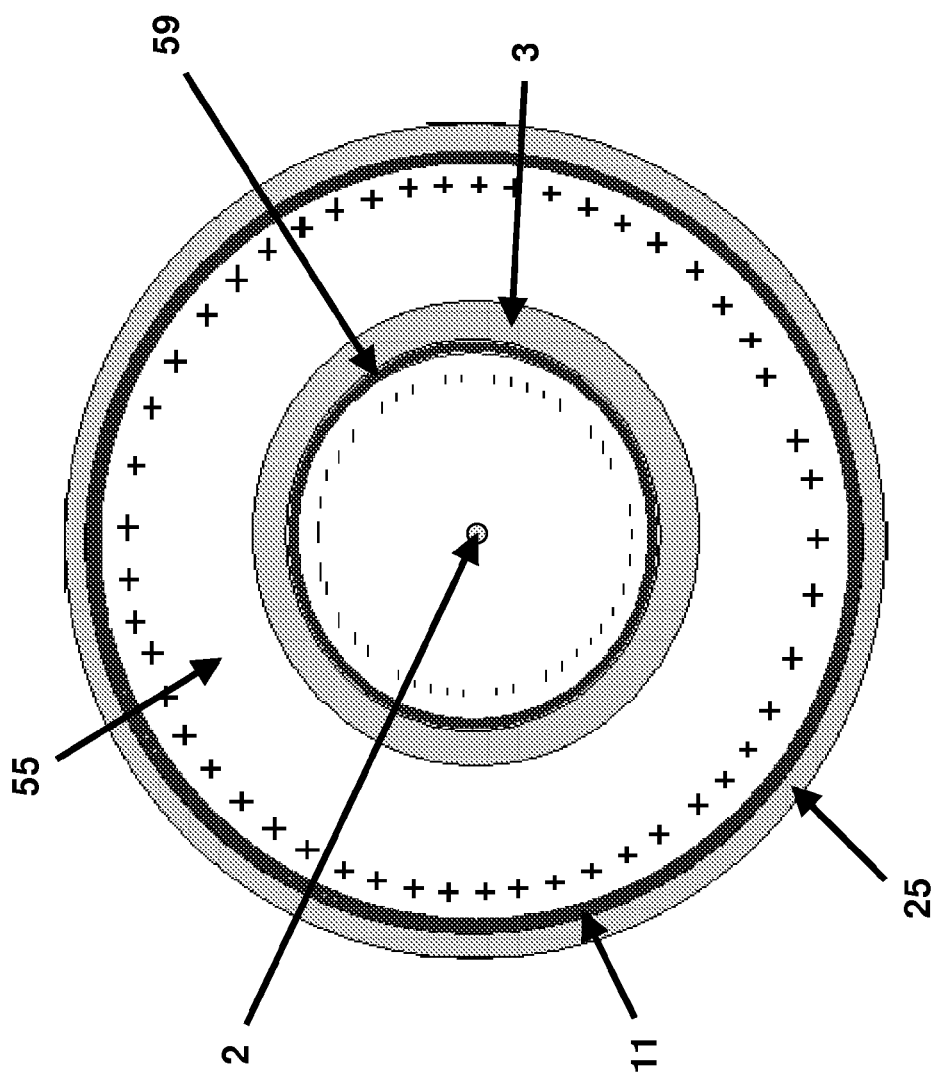
FIG. 5 depicts a cross-section view of an embodiment for the generation of one or more Magnetic Fields by rotating a Charge Holding Object having an Interior Conductive Coating and encased by a cylindrical Outer Conductor.

In the alternative, the inside of the Charge Holding Object 3, may have a conductive coating instead of the Exterior Conductive Coating 9, as shown in FIG. 4 and FIG. 5. FIG. 4 depicts a cross-section side view and FIG. 5 depicts the corresponding cross-section view of one embodiment of a Charge Holding Object 3 having an Interior Conductive Coating 59. In this embodiment, the Outer Cylinder 25 preferably has a cylindrical shape. The one or more Outer Conductors 11 comprises a conductive cylinder positioned inside and juxtaposed to the Outer Cylinder 25. A First Insulator 55 separates the one or more Outer Conductors 11 from the Charge Holding Object 3. The First Insulator 55 is electrically insulating, and allows the Charge Holding Object 3 to rotate about a Rotation Axis 2. Preferably, the First Insulator 55 is a gas.

In the alternative, the First Insulator 55 may also be an electrically insulating fluid. In a preferred embodiment, the First Insulator 55 is perfluoropolyalkylether (PFPE) derivatives. This embodiment has the effect of two capacitors in series, the First Insulator 55 and the Charge Holding Object 3 provide the adjoining first and second dielectric, respectively. The overall effect of adjoining capacitor dielectrics in series is to move the plates of the capacitors further apart. Since the capacitance of any capacitor is inversely proportional to the distance between the plates, the combined capacitance of the First Insulator 55 and the Charge Holding Object 3 will be less than the larger capacitance of the First Insulator 55 and the Charge Holding Object 3. Therefore, it is preferable, to have the Conductive Coating on the Exterior of the Charge Holding Object 3 when one or more Outer Conductors 11 are used. Likewise, it is preferable, to have the Conductive Coating on the Interior of the Charge Holding Object 3 when an Inner Conductor is used (see FIG. 6).

Adhesion of Exterior Conductive Coating 9 may fail for high rotation speeds of Charge Holding Object 3. Therefore, for loosely adhered Coatings such as liquid films, unsupported films, and particle films, it is advantageous to employ the Charge Holding Object 3 as a retaining structure for such films.

FIG. 4 also depicts the embodiment whereby the Rotation Means 5 causes a rotation of the Charge Holding Object 3, while also causing a rotation of the one or more Outer Conductors 11. Preferably, the rotation of the Charge Holding Object 3 is opposite of the rotation of the one or more Outer Conductors 11 whereby the strengths of the one or more Magnetic Fields 7 are increased.

FIG. 6

Figure 6:
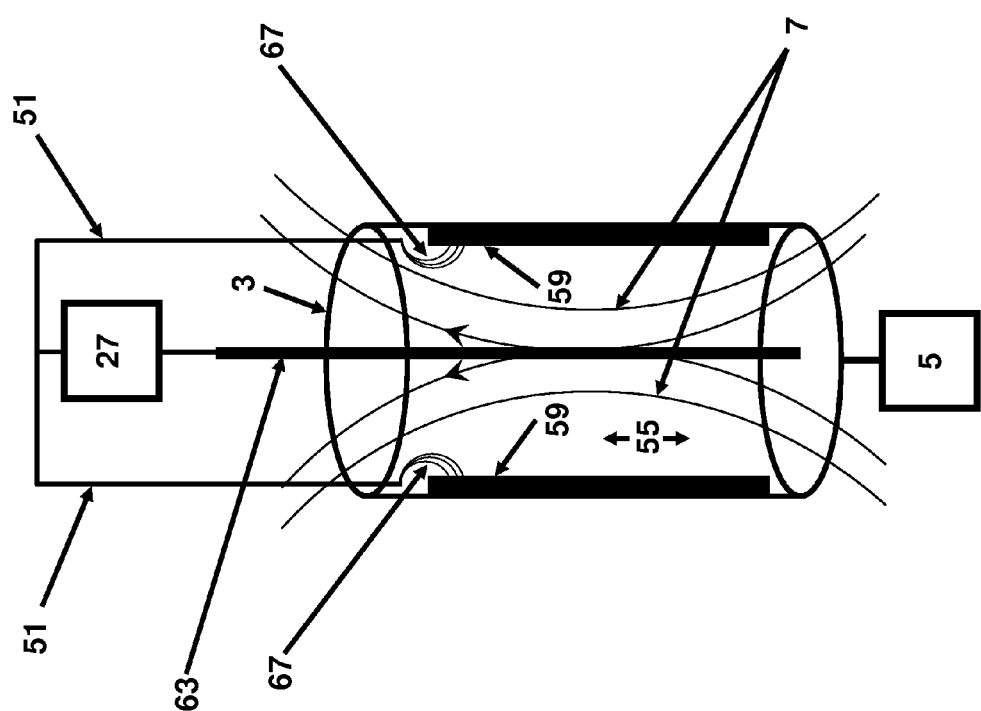
FIG. 6 depicts an embodiment for the generation of one or more Magnetic Fields by rotating a Charge Holding Object having an Interior Conductive Coating and an Inner Conductor continuously charged by a Voltage Source.

FIG. 6 depicts a rotating Charge Holding Object 3 having an Interior Conductive Coating 59 and one or more Inner Conductors 63 continuously charged by a Voltage Source 27. In this embodiment, a Charge Holding Object 3, having an Interior and an Exterior, is connected to a Rotating Means 5, which rotates the Charge Holding Object 3. The Interior of the Charge Holding Object 3 is at least partially coated with an Interior Conductive Coating 59. The Interior Conductive Coating 59 is the same as the Exterior Conductive Coating 9 shown in FIG. 2, except it is in the Interior rather than the Exterior of the Charge Holding Object 3. A Voltage Source 27 is electrically connected by one or more Wires 51 to and provides a voltage across the Interior Conductive Coating 59 and the one or more Inner Conductors 63. This embodiment is similar to FIG. 2, except for the use of the Interior Conductive Coating 59 and the one or more Inner Conductors 63 instead of the Exterior Conductive Coating 9 and the one or more Outer Conductors 11. In this embodiment, to produce a Magnetic Field 7 the one or more Inner Conductors 63 are held stationary or more preferably, rotated in a direction opposite of the rotation of the Charge Holding Object 3.

FIG. 7

Figure 7:
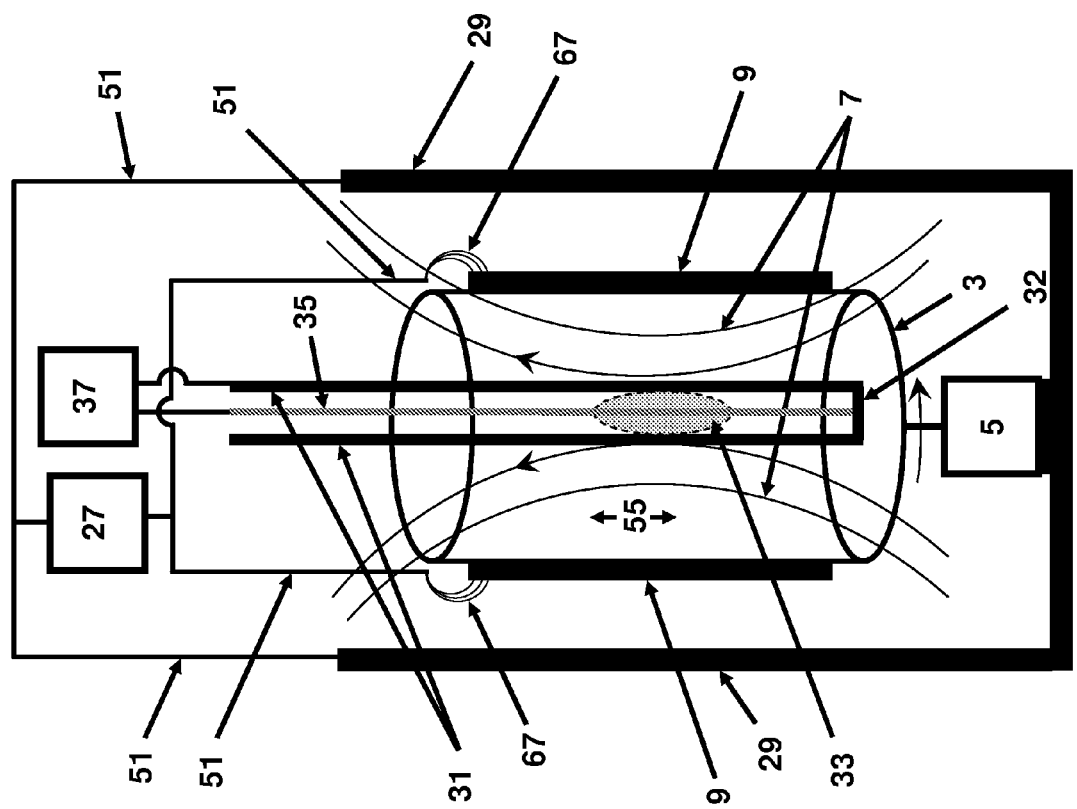
FIG. 7 depicts an embodiment for the generation of one or more Magnetic Fields by rotating a Charge Holding Object having an Exterior Conductive Coating continuously charged by a Voltage Source, whereby the generated one or more magnetic fields are used in magnetic resonance experiments.

FIG. 7 depicts a cross-section, side view of an embodiment for NMR systems. In this embodiment, a Charge Holding Object 3 is rotated by a Rotation Means 5, preferably a compressed gas turbine. An Electrically Conductive Container 29 is connected to the Rotation Means 5 and the Exterior of the Charge Holding Object 3 has an Exterior Conductive Coating 9. A Voltage Source 27 is electrically connected to the Exterior Conductive Coating 9 and the Electrically Conductive Container 29. A Hollow Inner Tube 31 having a Closed End 32 is positioned within the Charge Holding Object 3, preferably centrally. The Hollow Inner Tube 31 has a hollow center containing a Sample 33 and an NMR Conductor 35. The NMR Conductor 35 is connected to NMR Electronics 37 and the Closed End 32 of Hollow Inner Tube 31. The NMR Electronics 37 is also connected to Hollow Inner Tube 31 to energize NMR Conductor 35. The NMR Conductor 35 preferably runs centrally through the Sample 33.

The Voltage Source 27 is electrically connected to the Exterior Coating 9, by one or more Wire Brushes 67 and the Electrically Conductive Container 29, by one or more Wires 51. The Voltage Source 27 electrically charges the Exterior Coating 9, which generates a Magnetic Field 7 when rotated. As the Sample 33 is subjected to the one or more Magnetic Fields 7, the NMR Electronics 37 conduct NMR tests on the Sample 33 using the NMR Conductor 35.

In this embodiment, the Electrically Conductive Container 29 is hollow and connected to the Rotation Means 5. In a preferred embodiment, the Electrically Conductive Container 29 has a cylindrical shape and is made of a non-magnetic metal such as aluminum, silver, gold, titanium, beryllium, copper, or a combination thereof as well as other metals known in the art. Preferably, the Electrically Conductive Container 29 extends beyond the Charge Holding Object 3 to provide a substantially uniform charge distribution across the Charge Holding Object 3.

The Container 29 is rotatably connected to the Charge Holding Object 3, whereby the Charge Holding Object 3 is allowed to rotate, while the Container 29 remains stationary. In an alternate embodiment, the Container 29 is rotated by the Rotation Means 5, while the Charge Holding Object 3 remains stationary. In yet another alternate embodiment, the Charge Holding Object 3 and the Container 29 are both counter rotated, whereby the Charge Holding Object 3 is rotated in a direction opposite of the Container 29. For example, the Charge Holding Object 3 may be rotated in a first direction by the Rotation Means 5, while the Container 29 is rotated in a direction opposite of the first direction by a second rotation means.

The Hollow Inner Tube

The Hollow Inner Tube 31 is a hollow tube running within the Charge Holding Object 3. In a preferred embodiment, the Hollow Inner Tube 31 is made of a non-magnetic material such as aluminum, silver, gold, titanium, beryllium, copper, or a combination thereof as well as other metals known in the art. In a preferred embodiment, the Hollow Inner Tube 31 is removable allowing the user to conveniently insert the Sample 33 and the NMR Conductor 35 within the Hollow Inner Tube 31. In a preferred embodiment, the Hollow Inner Tube 31 runs centrally through the Charge Holding Object 3. The Hollow Inner Tube 31 is electrically conductive or has one or more electrically conductive layers.

In the alternative, the other Hollow Inner Tube 31 may have a variety of shapes as known in the art including, but not limited to, cylindrical, prolate spheroid, rectangular, cubicle, pyramidal, combinations thereof, or any other shape. Second NMR Conductors other than the Hollow Inner Tube 31 may also be used, for example a plurality of conductors may surround the Sample 33.

The Sample 33 is placed within the Hollow Inner Tube 31 within the one or more Magnetic Fields 7. In a preferred embodiment, the Sample 33 runs centrally through the Hollow Inner Tube 31. NMR analysis is performed on the Sample 33 passing between the NMR Conductor 35 and the Hollow Inner Tube 31.

In the alternative, one or more conductors may be used as a Second NMR Conductor instead of the Hollow Inner Tube 31. In this embodiment, the one or more Second NMR Conductors may be exterior to the sample 33 or interior to the Sample 33 whereby NMR analysis is performed on the Sample 33 passing between the NMR Conductor 35 and the single conductor.

Preferably, the Sample 33 is not rotated, rather remains stationary as the Charge Holding Object 3 is rotated. Preferably, the Sample 33, the Hollow Inner Tube 31, and the NMR Conductor 35 remain stationary as the Charge Holding Object 3 is rotated. Preferably, various means, as known in the art, are used to freely rotate the Charged Holding Object 3 while the Sample 33 and the Hollow Inner Tube 31 remain stationary, for example, lubricants, gears, bearings, etc.

In the alternative, the Sample 33 and the Hollow Inner Tube 31 may be rotated with the Charge Holding Object 3. In this embodiment, preferably one or more Wire Brushes are used to allow the Hollow Inner Tube 31 and the NMR Conductor 35 to rotate while maintaining their respective connections with the NMR Electronics 37. Other means of electrically connecting the Hollow Inner Tube 31 and the NMR Conductor 35 to the NMR Electronics 37 may also be used, for example conductive fluids, gears, ball bearings, etc.

The NMR Conductor

The NMR Conductor 35 is electrically connected to the NMR Electronics 37 and preferably the Closed End 32 of Hollow Inner Tube 31. The NMR Conductor 35 passes through the Sample 33. The NMR Conductor 35 passes through the Sample 33 preferably about parallel, more preferably parallel to the Rotation Axis 2. The NMR Conductor 35 is electrically conductive or has one or more electrically conductive layers. In a preferred embodiment, NMR Conductor 35 is made of a non-magnetic metal such as aluminum, silver, gold, titanium, beryllium, copper, or a combination thereof as well as other metals known in the art. In a preferred embodiment, the NMR Conductor 35 runs centrally through the Sample 33. More preferably, the Hollow Inner Tube 31, the Sample 33, and the NMR Conductor 35 all run centrally through the Charge Holding Object 3. In an alternate embodiment, a plurality of First NMR Conductors connected in series, or in parallel may be used for NMR analysis as known in the art. In yet another alternate embodiment, multiple First NMR Conductors connected to independent NMR Electronics are used to perform NMR analysis on the Sample 33; see U.S. Pat. No. 7,271,592, hereby fully incorporated by reference.

FIG. 8

Figure 8:
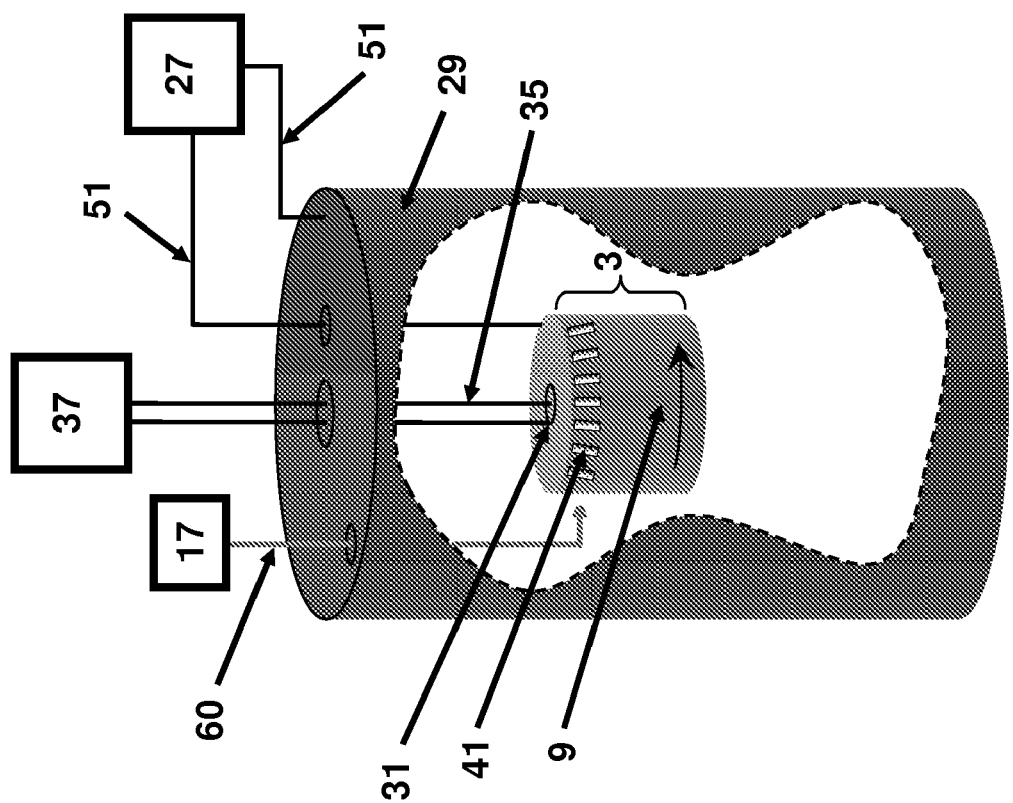
FIG. 8 depicts an embodiment for the generation of one or more Magnetic Fields by rotating a Charge Holding Object for NMR systems.

FIG. 8 depicts a side view of one embodiment of the present invention for NMR systems. In this embodiment, a Charge Holding Object 3 having an Exterior Conductive Coating 9 is contained within an Electrically Conductive Container 29. The Charge Holding Object 3 is cylindrical and connected to a Turbine 41; preferably, the Turbine 41 surrounds the outside of the Charge Holding Object 3. A Hollow Inner Tube 31 passes, preferably centrally, through the Charge Holding Object 3. A NMR Conductor 35 passes, preferably centrally, through the Hollow Inner Tube 31. A Sample, not shown for simplicity is placed in the Hollow Inner Tube 31. The NMR Conductor 35 preferably passes centrally through the Sample 33.

As in FIG. 7, the Sample 33, the Hollow Inner Tube 31, and the NMR Conductor 35 remain stationary as the Charge Holding Object 3 is rotated. Preferably, various means, as known in the art, are used to freely rotated the Charge Holding Object 3 while the Sample 33 and the Hollow Inner Tube 31 remain stationary, for example, lubricants, gears, bearings, etc.

A Compressed Gas Source 17 is connected to the Gas Line 60 and supplies compressed gas to the Turbine 41. As the compressed gas passes across the Turbine 41, which is rigidly connected to the Charge Holding Object 3, a force is acted on the Charge Holding Object 3 causing it to rotate.

A Voltage Source 27 is electrically connected by one or more Wires 51 to the Exterior Conductive Coating 9 and the Electrically Conductive Container 29, creating a radial Electric Field, which charges the Charge Holding Object 3. The one or more Wires 51 are connected to the Exterior Conductive Coating 9 so as to not interfere with the rotation of the Charge Holding Object 3, preferably by a wire brush or conductive fluid (not shown for simplicity). NMR Electronics 37 is electrically connected to the NMR Conductor 35 and Hollow Inner Tube 31 to produce a radio wave for NMR testing. Preferably, the Electrically Conductive Container 29 is at about electrical ground. In the alternative, the Hollow Inner Tube 31 is maintained at about electrical ground.

FIG. 9

FIG. 9 depicts yet another embodiment of the present invention having a means for selectively charging and selectively discharging the Charge Holding Object 3. In this embodiment, a Charge Holding Object 3 is rotated by a Rotation Means 5, preferably a compressed gas turbine. An Electrically Conductive Container 29 is connected to the Rotation Means 5. The Exterior of the Charge Holding Object 3 has an Array of Electrically Isolated Elements 65. Preferably, the Array of Electrically Isolated Elements 65 is a plurality of electrically conductive coatings, each electrically isolated from each other.

One or more Voltage Sources 28 are electrically connected to the Array of Electrically Isolated Elements 65. Each element of the Array 65 is electrically connected by one or more Wires 51 and one or more Wire Brushes (not shown for simplicity) to a corresponding Voltage Source from the one or more Voltage Sources 28.

A Hollow Inner Tube 31 is positioned within the Charge Holding Object 3, preferably centrally. The Hollow Inner Tube 31 has a hollow center and a Closed End 32. The Hollow Inner Tube 31 contains a Sample 33 and an NMR Conductor 35. The NMR Conductor 35 is connected to the NMR Electronics 37 and the Closed End 32 of Hollow Inner Tube 31. The NMR Conductor 35 preferably runs centrally through the Sample 33. NMR Electronics 37 is electrically connected to the NMR Conductor 35 and Hollow Inner Tube 31 to produce a radio wave for NMR testing.

Each element in the Array 65 is electrically connected by the one or more Wire Brushes (not shown for simplicity) to a corresponding Voltage Source from the one or more Voltage Sources 28 and selectively charged or discharged by the Voltage Source. For example, a single Voltage Source 28 may produce a waveform that is electronically or mechanically switched to each element of the Array 65. As another example, the one or more Voltage Sources 28 may be a plurality of voltage sources each connected to a corresponding element of the Array 65. In this embodiment, the spatially sequestered charges on the Charge Holding Object 3 can be altered and thereby alter the Magnetic Field 7 generated by the rotating Charge Holding Object 3. Therefore, the operator can precisely control the Magnetic Field 7. Preferably, each Voltage Source 28 is connected to a computer or other means of automatic control. More preferably each Voltage Source 28 is controlled by a feedback loop comprising the NMR Electronics 37 and a computer.

The one or more Wire Brushes (not shown for simplicity) allow the Charge Holding Object 3 to rotate about its Rotational Axis 2. In the alternative, any means to electrically connect the Voltage Source 28 to the Array 65 may be used, for example conductive fluids, gears, ball bearings, etc.

As in FIG. 7, the Sample 33, the Hollow Inner Tube 31, and the NMR Conductor 35 remain stationary as the Charge Holding Object 3 is rotated. Preferably, various means, as known in the art, are used to freely rotate the Charge Holding Object 3 while the Sample 33 and the Hollow Inner Tube 31 remain stationary, for example, lubricants, gears, bearings, etc.

As the Charge Holding Object 3 is rotated the Sample 33 is exposed to one or more Magnetic Fields 7, generated by the rotation of the Charge Holding Object 3. As the Sample 33 is subjected to the one or more Magnetic Fields 7 the NMR Electronics 37 conducts NMR tests on the Sample 33, using the NMR Conductor 35.

In an alternate embodiment, each element in the Array 65 may be selectively charged, discharged, or a combination thereof by one or more Charging Pins slidably movable parallel along the length of the Charge Holding Object 3.

In yet another embodiment the Array of Electrically Isolated Elements 65 is an array of electrically insulating elements. In this embodiment each element is directly charged, for example by an electron gun.

In the alternative, the Interior of the Charge Holding Object 3 may similarly have an Array of Electrically Isolated Elements 65 instead of, or in combination with an Exterior Array of Electrically Isolated Elements 65.

FIG. 10

FIG. 10 depicts a side view of an embodiment having one or more Electron Guns 61 electrically charging the Charge Holding Object 3. In this embodiment, a Charge Holding Object 3 is rotated by a Rotation Means 5. As the Charge Holding Object 3 is rotated by the Rotation Means 5, it is bombarded with electrons from one or more Electron Guns 61. Therefore, the Charge Holding Object 3 is charged, and its rotation generates one or more Magnetic Fields 7.

The one or more Electron Guns 61 generate electrons and accelerate the electrons towards the Charge Holding Object 3. Examples of Electron Guns include, field emission, thermionic electron gun, for example heated tungsten (such as described in U.S. Pat. No. 6,828,996), laser based electron guns, and combinations thereof.

FIG. 11

FIG. 11 depicts a cross-section side view of one embodiment for NMR systems of a Charge Holding Object 3 continuously charged by one or more Electron Guns 61 and a having an Interior Conductive Coating 59 and an Exterior Conductive Coating 9 continuously charged by a Voltage Source 27. In this embodiment, a Charge Holding Object 3 is contained within an Electrically Conductive Container 29 and is rotated by a Rotation Means 5. As the Charge Holding Object 3 is rotated by the Rotation Means 5, it is bombarded with electrons from one or more Electron Guns 61.

The Charge Holding Object 3 has an Interior Conductive Coating 59 and an Exterior Conductive Coating 9 electrically connected to a Voltage Source 27 by one or more Wires 51 and one or more Wire Brushes 67. The Electrically Conductive Container 29 is also connected to the Voltage Source 27 by one or more Wires 51. Therefore, the Charge Holding Object 3 is charged by the one or more Electron Guns 61, and the rotation of the Charge Holding Object 3 generates one or more Magnetic Fields 7. Furthermore, the rotation of the Charge Holding Object 3 having an Interior Coating 59, and an Exterior Coating 9 connected to the Voltage Source 27 also generates one or more Magnetic Fields 7, preferably complementary magnetic fields to the magnetic field generated from charge supplied from the one or more Electron Guns 61.

In this embodiment, a Hollow Inner Tube 31 having a Closed End 32 is positioned within the Charge Holding Object 3, preferably centrally. The Hollow Inner Tube 31 has a hollow center containing a Sample 33 and an NMR Conductor 35. The NMR Conductor 35 is connected to NMR Electronics 37 and Closed End 32, and preferably runs centrally through the Sample 33. As the Charge Holding Object 3 is rotated, the Sample 33 is subjected to one or more Magnetic Fields 7 generated by the charged Interior Coating 59, Exterior Coating 9, or Charge Holding Object 3. The one or more Magnetic Fields 7 and the NMR Electronics 37 are preferably used to perform NMR tests.

As in FIG. 7, the Sample 33, the Hollow Inner Tube 31, and the NMR Conductor 35 remain stationary as the Charge Holding Object 3 is rotated. Preferably, various means, as known in the art, are used to freely rotated the Charge Holding Object 3 while the Sample 33 and the Hollow Inner Tube 31 remain stationary, for example, lubricants, gears, bearings, etc.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

A plurality of the Charge Holding Object may be used in various configurations to create various magnetic fields, as known in the art. In one embodiment, one or more Charge Holding Objects are nested in a Charge Holding Object. In this embodiment, all the Charge Holding Object s are preferably concentric and rotated about the same Rotation Axis.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

The embodiment of the invention in which an exclusive property or privilege is claimed is defined as follows:

1. A device comprising:
   a. a Charge Holding Object having an Interior and an Exterior;
   b. a Sample positioned within said Interior;
   c. a means for electrically charging said Charge Holding Object;
   d. a means for rotating said Charge Holding Object about a Rotation Axis;
   e. said means for rotating connected to said Charge Holding Object whereby a Magnetic Field is generated by the rotation of said Charge Holding Object; and
   f. a means for producing a B1 field in order to perform NMR analysis.

2. The device of claim 1 whereby said Charge Holding Object is a dielectric.

3. The device of claim 1 whereby said Charge Holding Object is electrically conductive.

4. The device of claim 1 whereby said Charge Holding Object comprises zirconia.

5. The device of claim 1 whereby said means for charging comprises a means for selectively charging portions of said Charge Holding Object.

6. The device of claim 1 further comprising a means for selectively discharging portions of said Charge Holding Object.

7. The device of claim 1 further comprising:
   a. an Inner Conductor running within said Interior and about parallel to said Rotation Axis;
   b. said Interior having a Conductive Coating at least partially covering said Interior; and
   c. a Voltage Source electrically connected to said Inner Conductor and said Conductive Coating.

8. The device of claim 1 further comprising:
   a. an Inner Conductor running within said Interior and about parallel to said Rotation Axis;
   b. said Interior having a plurality of electrically isolated elements forming an Array; and
   c. one or more Voltage Sources electrically connected to said Inner Conductor and a corresponding element of said Array.

9. The device of claim 1 further comprising:
   a. one or more Outer Conductors positioned exterior to said Charge Holding Object;
   b. said Exterior having a plurality of electrically isolated elements forming an Array; and
   c. one or more Voltage Sources each electrically connected to an Outer Conductor from said one or more Outer Conductors and a corresponding element of said Array.

10. The device of claim 1 whereby said means for charging comprises an Electron Gun.

11. The device for generating a Magnetic Field of claim 1 further comprising:
    a. said means for producing a B1 field comprises one or more First NMR Conductors running through said Sample; and
    b. NMR Electronics electrically connected to said one or more First NMR Conductors.

12. The device of claim 11 whereby:
    a. said one or more First NMR Conductors run centrally through said Charge Holding Object; and
    b. said one or more First NMR Conductors run centrally through said Sample.

13. The device of claim 11 further comprising:
    a. an Inner Conductor running within said Interior;
    b. said Interior having a Conductive Coating at least partially covering said Interior; and
    c. a Voltage Source electrically connected to said Inner Conductor and said Conductive Coating.

14. The device of claim 11 further comprising:
    a. an Inner Conductor running within said Interior;
    b. said Interior having a plurality of electrically isolated elements forming an Array; and
    c. one or more Voltage Sources electrically connected to said Inner Conductor and a corresponding element of said Array.

15. The device of claim 11 further comprising:
    a. one or more Outer Conductors positioned exterior to said Charge Holding Object;
    b. said Exterior having a Conductive Coating at least partially covering said Exterior; and
    c. a Voltage Source electrically connected to said one or more Outer Conductors and said Conductive Coating.

16. The device of claim 15 whereby:
    a. said means for rotating rotates said Charge Holding Object at a speed greater than 1000 rotations per second;
    b. said one or more First NMR Conductors run centrally through said Charge Holding Object;
    c. said one or more First NMR Conductors run centrally through said Sample; and
    d. said means for charging further comprises an electron gun.

17. The device of claim 15 whereby:
    a. said means for rotating rotates said Charge Holding Object at a speed greater than 1000 rotations per second;
    b. said Voltage Source provides a voltage greater than 1,000 Volts;
    c. said one or more First NMR Conductors run centrally through said Charge Holding Object;
    d. said one or more First NMR Conductors run centrally through said Sample;
    e. said means for rotating comprises one or more Turbines and a means for supplying a Fluid;
    f. said one or more Turbines are fixedly connected to said Charge Holding Object; and
    g. said means for supplying a Fluid is connected to said one or more Turbines, whereby Fluid from said means for supplying causes said one or more Turbines and therefore said Charge Holding Object to rotate about said Rotation Axis.

18. The device of claim 11 further comprising:
    a. one or more Outer Conductors positioned exterior to said Charge Holding Object;
    b. said Exterior having a plurality of electrically isolated elements forming an Array; and
    c. one or more Voltage Sources electrically each connected to an Outer Conductor from said one or more Outer Conductors and a corresponding element of said Array.

19. A device comprising:
    a. a Charge Holding Object having an Interior and an Exterior;
    b. a Sample Positioned within said Interior;
    c. a means for electrically charging said Charge Holding Object;

d. a means for rotating said Charge Holding Object about a Rotation Axis;
e. said means for rotating connected to said Charge Holding Object whereby a Magnetic Field is generated by the rotation of said Charge Holding Object; and
f. a means for producing a B1 field in order to perform NMR analysis;
g. one or more Outer Conductors positioned exterior to said Charge Holding Object;
h. said Exterior having a Conductive Coating at least partially covering said Exterior; and
i. a Voltage Source electrically connected to said one or more Outer Conductors and said Conductive Coating.

20. A device comprising:
a. a Charge Holding Object having an Interior and an Exterior;
b. a Sample positioned within said Interior;
c. a means for electrically charging said Charge Holding Object;
d. a means for rotating said Charge Holding Object around a Rotation Axis;
e. said means for rotating connected to said Charge Holding Object whereby a Magnetic Field is generated by the rotation of said Charge Holding Object;
f. one or more First NMR Conductors running through said Sample;
g. one or more Second NMR Conductors running through said Sample; and
h. NMR Electronics electrically connected to said one or more First NMR Conductors and said one or more Second NMR Conductors.

* * * * *